United States Patent [19]

Sato et al.

[11] Patent Number: 5,075,249

[45] Date of Patent: Dec. 24, 1991

[54] METHOD OF MAKING A BIC MEMORY CELL HAVING CONTACT OPENINGS WITH STRAIGHT SIDEWALLS AND SHARP-EDGE RIMS

[75] Inventors: Noriaki Sato, Machida; Kazunori Imaoka, Komae, both of Japan

[73] Assignee: Fujitsu Limited, Kawasaki, Japan

[21] Appl. No.: 331,193

[22] Filed: Mar. 31, 1989

[30] Foreign Application Priority Data

Apr. 4, 1988 [JP] Japan .................................. 63-82746
Apr. 4, 1988 [JP] Japan .................................. 63-82747

[51] Int. Cl.⁵ ............................................ H01L 21/70
[52] U.S. Cl. ........................................ 437/52; 437/40; 437/41; 437/170; 437/228; 437/235
[58] Field of Search .................. 437/29, 40, 41, 52, 437/235, 228, 170; 365/186; 357/40

[56] References Cited

U.S. PATENT DOCUMENTS

| | | | |
|---|---|---|---|
| 3,969,150 | 7/1976 | Luce | 437/41 |
| 4,282,647 | 8/1981 | Richman | 437/41 |
| 4,288,256 | 9/1981 | Ning et al. | 437/41 |
| 4,388,147 | 6/1983 | Engel | 437/235 |
| 4,442,591 | 4/1984 | Haken | 437/41 |
| 4,453,325 | 6/1984 | Razouk | 437/235 |
| 4,498,224 | 2/1985 | Maeguchi | 437/41 |
| 4,637,124 | 1/1987 | Okuyama | 437/41 |

FOREIGN PATENT DOCUMENTS 62-26854 2/1987 Japan .

OTHER PUBLICATIONS

"A New Programmable Cell Utilizing Insulator Breakdown", Sato et al, IEDM 85, pp. 639-642, 1985.

Primary Examiner—Brian E. Hearn
Assistant Examiner—T. Thomas
Attorney, Agent, or Firm—Armstrong, Nikaido, Marmelstein, Kubovcik & Murray

[57] ABSTRACT

A BIC memory cell device comprises a first insulating layer covering a MOS structure, a first penetrating opening in the first insulating layer in correspondence to a drain region and defined by an inclined first side wall which defines the diameter of the first opening such that the diameter increases towards a top surface of the first insulating layer, a second penetrating opening in the first insulating layer in correspondence to a source region and defined by a second side wall having a straight vertical cross section, a third penetrating opening in the first insulating layer in correspondence to a gate electrode and defined by a third side wall having a straight vertical cross section, a second insulating layer provided on the first insulating layer in correspondence to the drain region, a first wiring electrode deposited such that the second insulating layer is sandwiched between the first wiring electrode and the drain region, and second and third wiring electrodes contacting with the source region and the gate electrode.

10 Claims, 12 Drawing Sheets

CONVENTIONAL

PRESENT INVENTION

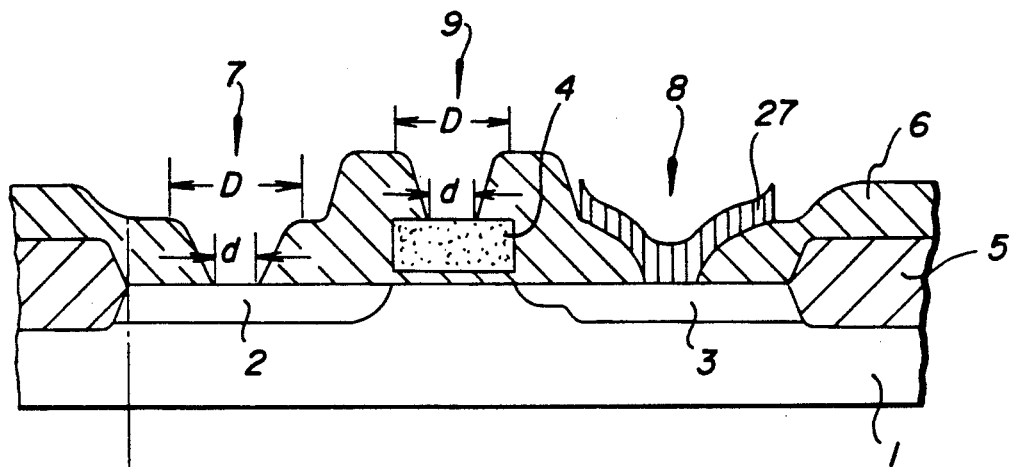
FIG. 6A  CONVENTIONAL
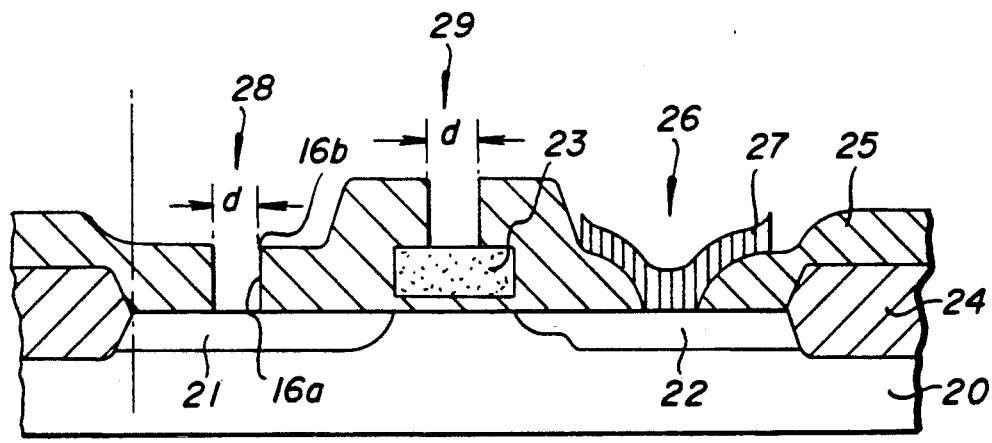
FIG. 6B  PRESENT INVENTION

METHOD OF MAKING A BIC MEMORY CELL HAVING CONTACT OPENINGS WITH STRAIGHT SIDEWALLS AND SHARP-EDGE RIMS

BACKGROUND OF THE INVENTION

The present invention generally relates to programmable memory cell devices and more particularly to a so-called BIC memory cell device and a manufacturing method thereof.

A BIC (Breakdown-of-Insulator-for-Conduction) memory cell device is a programmable memory cell device comprising a MOS transistor having a drain region connected to a bit line via a thin insulator film and a source region connected to the ground (see for example, Sato N. et al. A New Programmable Cell Utilizing Insulator Breakdown. IEDM 85, pp.639–642, IEEE 1985). The gate of the MOS transistor is connected to a word line and the writing of a data is made by causing a breakdown in the thin insulator film by applying a high voltage to a selected bit line while at the same time applying a predetermined voltage to a selected word line. This high voltage is chosen such that the thin insulator film is destroyed with reliability at this voltage. Responsive to the breakdown of the thin insulator film, the drain of the MOS transistor is connected directly to the bit line. When reading out the data, another bit line voltage substantially lower than the first bit line voltage is applied to a selected bit line while applying the predetermined word line voltage to a selected word line. This second bit line voltage is chosen such that the breakdown of the thin insulator film does not occur even when such a voltage is applied to the bit line. When the addressed memory cell is the one already written with a data, the bit line is connected to the ground via the MOS transistor and the bit line voltage thus produced assumes a low level state. When the addressed memory cell is not written with the data, on the contrary, the bit line is insulated from the ground and thus the bit line voltage assumes a high level state.

Such a device has a simple structure and easily manufactured in a form of integrated circuit. Further, it can be manufactured by a step which is almost the same as the manufacturing step of a dynamic random access memory and thus the manufacturing cost can be reduced. Further, such a memory device is more reliable as compared to conventional programmable read only memories using fuse as the means for writing the data. Furthermore, the BIC memory cell device has a writing speed of less than 1 μsec which is faster than any other programmable read only memories available at the present time.

In order to obtain a reliable operation in such a memory cell device, it is essential that the breakdown of the insulator film occurs uniformly at the high bit line voltage throughout a number of MOS transistors in the memory cell device. For this purpose, conventional BIC memory cell devices use a structure in which a penetrating hole, provided in an insulator layer covering the drain region of the MOS transistor so as to allow the connection of the bit line to the drain region via the thin insulator film, has a blunted cross section such that no sharp edge or kink is formed in the thin insulator film. When a sharp edge or kink is present in the thin insulator film, such a part tends to invite a concentration of electrical field and there is a substantial risk that the insulator film causes the breakdown prematurely at a low bit line voltage, for example when reading out the data from the memory cell. When such a premature breakdown occurs, erroneous writing of data is made.

In order to avoid such a problem and to secure a reliable operation, the conventional BIC memory cell device uses holes having the blunted cross section as already described. When manufacturing a BIC memory cell device having such a structure, holes for the source region and for the drain region are usually formed at the same time by etching. The sharp edge of the holes thus formed are then blunted by annealing. In such a procedure, however, there is a problem in that both of the holes, one for the source region and one for the drain region, are blunted by the annealing. As the blunted cross section is not necessary for the hole for the source region which is connected directly to the ground, and as such a blunted cross section occupies a substantial area in the substrate, there is a problem in the conventional BIC memory device that the memory cell device manufactured by such a process has an unnecessarily large size and is therefore disadvantageous for increasing an integration density when a memory cell array is constructed by assembling numerous BIC memory cell devices in a form of integrated circuit.

SUMMARY OF THE INVENTION

Accordingly, it is a general object of the present invention to provide a novel and useful BIC memory cell device and a manufacturing method thereof wherein the problems aforementioned are eliminated.

Another and more specific object of the present invention is to provide a BIC memory cell device and a manufacturing method thereof wherein the size of the BIC memory cell device can be substantially reduced.

Another object of the present invention is to provide a manufacturing method of a BIC memory cell device having a substantially reduced size wherein the number of steps needed for producing the device is reduced.

Another object of the present invention is to provide a BIC memory cell device and a manufacturing method thereof in which a MOS transistor having a drain region connected to a bit line via a thin insulator film and a source region connected to the ground is formed on a substrate, and an edge of a first penetrating hole, provided in an insulator layer on the substrate in correspondence to the drain region for allowing the connection of the bit line to the drain region via the thin insulator film, is blunted while a second penetrating hole, provided in the insulator layer in correspondence to the source region for allowing the connection of the source region to the ground, is made to have a sharp edge. According to the present invention, the premature breakdown of the thin insulator film at the time of reading out the data and the like is eliminated as a result of the use of the blunted edge for the first hole. At the same time, the size of the BIC memory cell can be reduced as a result of the use of the second hole having a sharp edge.

Other objects and further features of the present invention will become apparent from the following detailed description for preferred embodiments when read in conjunction with attached drawings.

BRIEF DESCRIPTION OF THE DRAWINGS

FIG. 6 is a cross sectional view showing the reduction in size of the improved BIC memory cell device of the present invention in comparison with a prior art BIC memory cell manufactured by the prior art process shown in FIGS. 2(A)–(G) or FIGS. 4(A)–(I);

DETAILED DESCRIPTION

Figure 1:
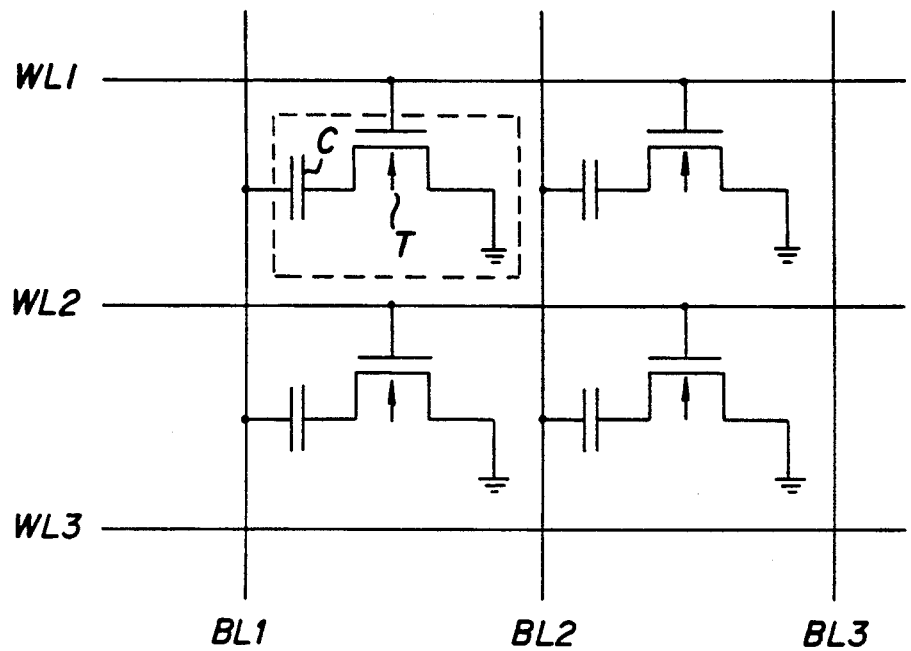
FIG. 1 is a circuit diagram showing a general structure of a BIC memory cell device.

FIG. 1 shows a general structure of a BIC memory cell device. A BIC memory cell device is essentially a MOS transistor T having a source connected to the ground, a drain connected to a bit line such as BL1 via an insulator film C, and a gate connected to a word line such as WL1. When writing a data "1", for example, a predetermined word line voltage is applied to a selected word line such as WL1 and at the same time a high first bit line voltage is applied to a selected bit line such as BL1. As a result of the predetermined word line voltage at the gate of the transistor T, the drain of the MOS transistor T is connected to the ground. Thus, a high bit line voltage is applied directly across the insulator film C and a breakdown is caused in the insulator film C. Responsive to the breakdown of the insulator film C, the data "1" is written into the BIC memory cell device. When reading out the data from the BIC memory cell device, a second bit line voltage which is substantially lower than the first bit line voltage is applied to the selected bit line together with simultaneous application of the predetermined word line voltage to the selected word line. When the addressed memory cell is the one already written with the data "1", the bit line is connected to the ground through the MOS transistor T and the bit line voltage assumes a low level state. On the contrary, when the addressed memory cell is the one not written with the data "1", which means that the data stored in the memory cell device is "0", the bit line voltage assumes a high level state indicating that the addressed data is zero.

Next, a conventional process of manufacturing a BIC memory cell will be described with reference to FIGS. 2(A)–(G).

Figure 2A:
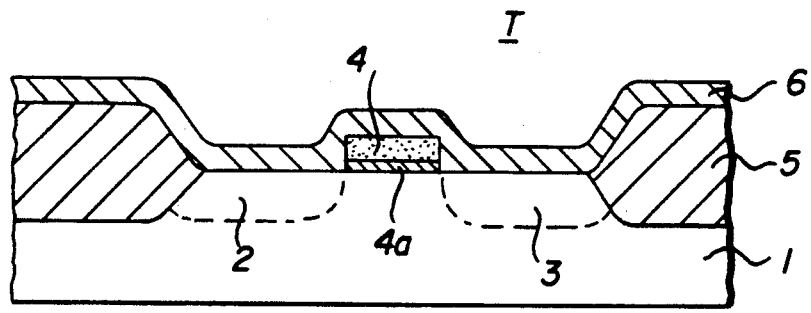
FIGS. 2(A)–(G) are cross sectional views showing various steps of manufacturing a prior art BIC memory cell device according to a prior art manufacturing process.

In a series of steps preceding a step shown in FIG. 2(A), a MOS structure T comprising a source region 2, a drain region 3 and a gate electrode 4 is formed on a silicon substrate 1. The MOS structure may be the structure of a p-channel MOS transistor or an n-channel MOS transistor. In the case of the p-channel MOS transistor, the substrate 1 is doped to the n-type and the source region 2 and the drain region 3 are doped to the p+-type In the case of the n-channel MOS transistor, on the other hand, the substrate 1 is doped to the p-type and the source region 2 and the drain region 3 are doped to the n+-type As usual, the MOS transistor T is separated from adjacent MOS transistors (not shown) by a field isolating structure 5 which may be a silicon oxide layer formed on the substrate 1 by oxidization of the substrate 1. The gate electrode 4 is separated from the substrate 1 by a gate oxide layer 4a and the entire structure including the source region 2, the drain region 3, the gate electrode 4 and the isolating silicon oxide layer 5 are covered by a protective glass layer 6 which may be a phospho-silicate glass (PSG). Hereinafter, it is assumed that the layer 6 is made of the phospho-silicate glass and will be referred to as PSG layer 6. It should be noted, however, that the material for the layer 6 is not limited to PSG but other materials such as silica may be used as well.

Figure 2B:
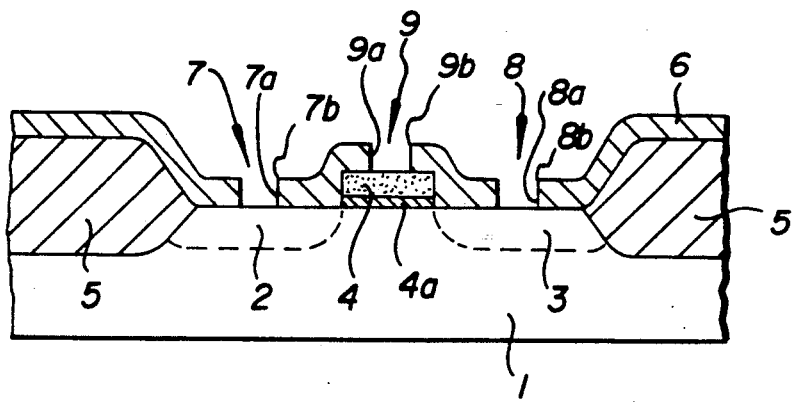

Next, in a step of FIG. 2(B), penetrating holes 7, 8 and 9 are formed through the PSG layer 6 in correspondence to the source region 2, the drain region 3 and the gate electrode 4. These holes may be formed by anisotropic etching such as reactive ion etching and is defined by walls 7a, 8a and 9a which extend perpendicularly to the substrate 1. It should be noted that these holes 7, 8 and 9 have sharply defined edges 7b, 8b and 9b at a rim of the respective holes. Next, the structure thus formed is subjected to heat treatment in a step of FIG. 2(C) and the sharp edges 7b, 8b and 9b at the rim of the holes 7, 8 and 9 are blunted as shown in by inclined walls 7c, 8c and 9c in FIG. 2(C). Next, insulator film 10 such as silicon nitride $Si_3N_4$ is deposited on the entire structure uniformly as shown in FIG. 2(D). Further, the insulator film 10 is removed except for the drain region 3 by etching as shown in FIG. 2(E). Next, a wiring conductor layer 11 is deposited over the entire structure in a step of FIG. 2(F). Finally, the wiring conductor layer 11 is patterned in a step of FIG. 2(G) and a wiring electrode 12 for the source region 2, a wiring electrode 13 for the gate electrode 4 and a wiring electrode 14 for the drain region 3 are formed.

In this conventional manufacturing procedure, the premature breakdown of the insulator film 10 is prevented by depositing the film 10 on a blunted surface such as the wall 8c of the hole 8. However, there is a problem in that a part of the source region 2 may be removed by excessive etching when removing a part of the insulator film 10 in the step in FIG. 2(E). As the source region 2 is critical to the operation of the MOS transistor T, the etching for removing the silicon nitride insulator film 10 must be controlled with extreme care such that the etching of the film 10 is stopped exactly when the removal of the film 10 is completed and the surface of the source region 2 is exposed without excessive etching. However, such an extreme precision in the control of the etching is difficult in the presently available technique.

Figure 3:
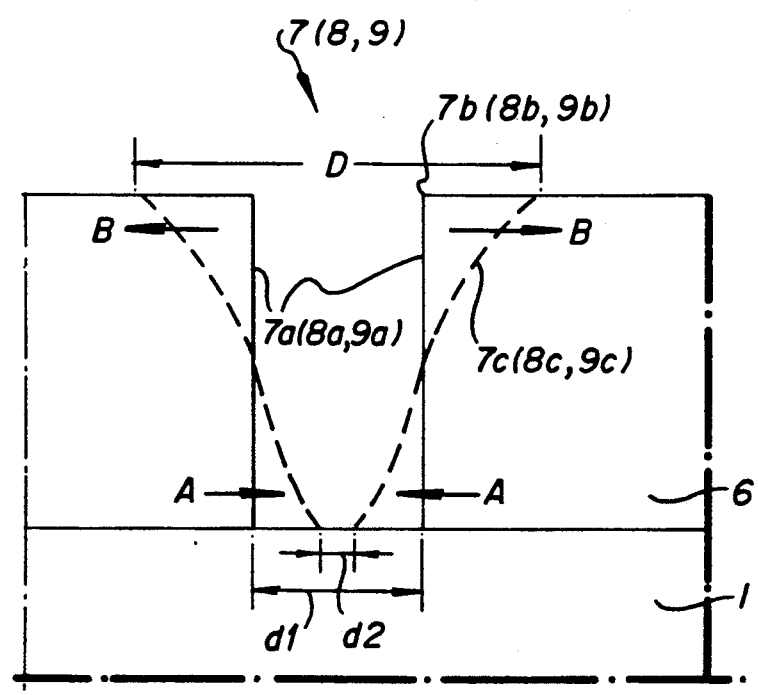
FIG. 3 is an enlarged view showing the change in cross section of holes in the device of FIGS. 2(A)–(G) as a result of reflow.
Figure 2C:
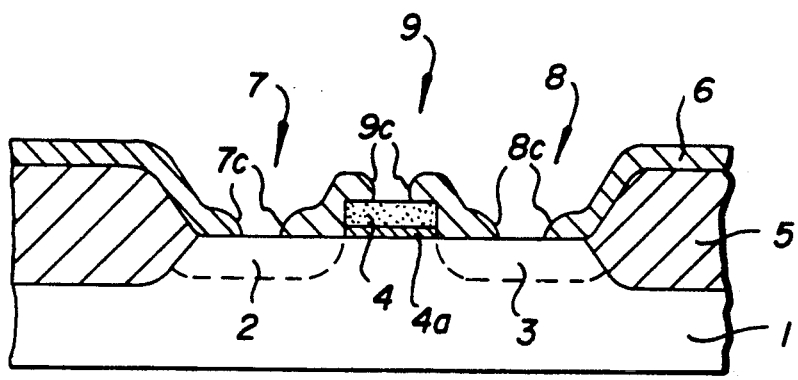
Figure 2D:
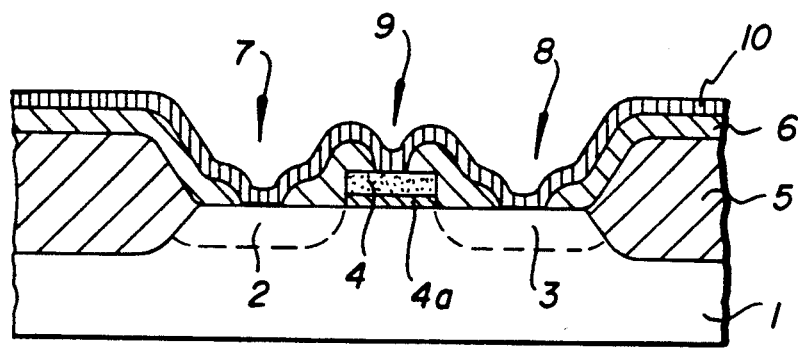
Figure 2E:
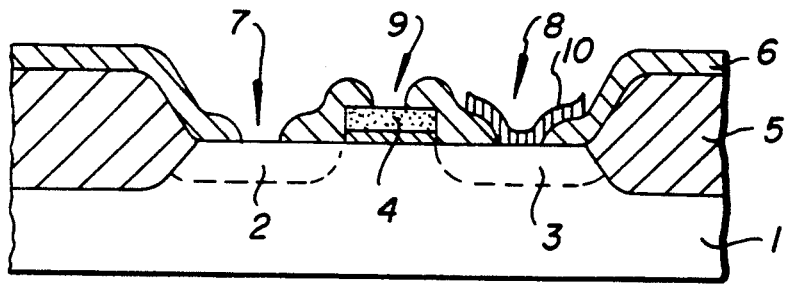
Figure 2F:
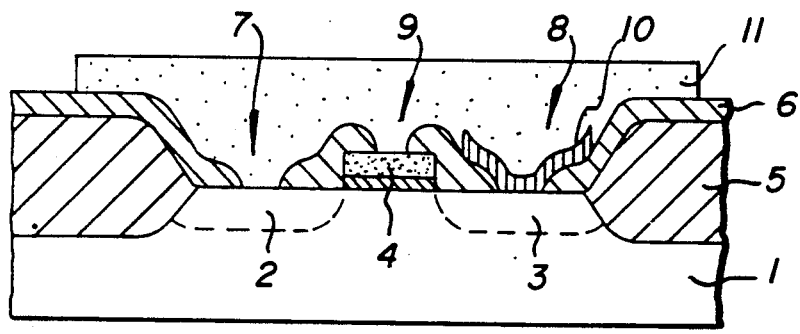
Figure 2G:
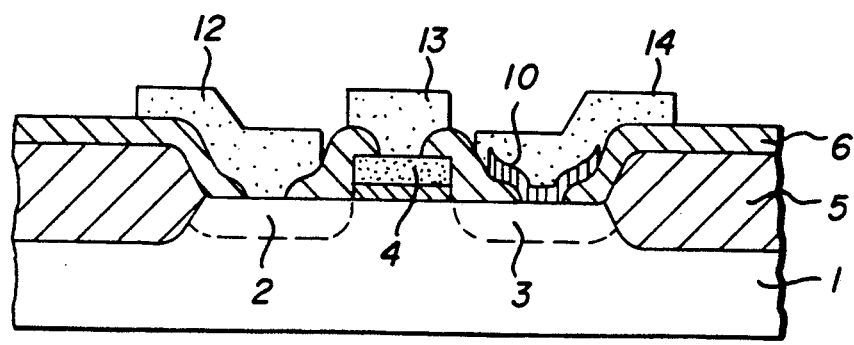

Further, the conventional manufacturing procedure has a problem in that all of the holes 7–9 the blunted walls 7c–9c and the diameter of the holes 7 and 9 for the source region 2 and the gate electrode 4 is increased unnecessarily as a result of the annealing in the step in FIG. 2(C). Referring to FIG. 3, when a reflow is caused in the PSG layer 6 responsive to the annealing, the diameter at the bottom of the holes such as 7, 8 or 9 is decreased from an initial diameter $d_1$ to a diameter $d_2$ as indicated by an arrow A. At the same time, the diameter at the top of the holes is increased from the initial diameter $d_1$ to a diameter D as indicated by an arrow B as a result of the reflow. Therefore, in order to secure a sufficient diameter such as the diameter $d_1$ at the bottom of the holes, the diameter D at top of these holes inevitably becomes large. As will be easily understood, such an increase in the diameter D invites an excessive increase in the size of the BIC memory cell device.

It should be noted that the hole 7 for the source region 2 or the hole 9 for the gate electrode 4 is not necessarily be blunted but may have the straight wall 7a or 9a shown in FIG. 2(B), as there is no insulator film 10 provided in this region. However, as the holes 7 and 9 are formed simultaneously with the hole 8 in the PSG layer 6 in this conventional manufacturing process, it is inevitable that the edge of the holes 7 and 9 is blunted at the time the edge 8b of the hole 8 is blunted by annealing. Thus, the conventional BIC memory cell device has unnecessarily large size which is disadvantageous for constructing an integrated circuit using such BIC memory cell devices.

FIGS. 4(A)-(I) show another conventional process of manufacturing a BIC memory cell device. In the drawing, these parts constructed identically to those corresponding parts in FIGS. 2(A)-(G) are given identical reference numerals and the description thereof will be omitted.

Figure 4A:
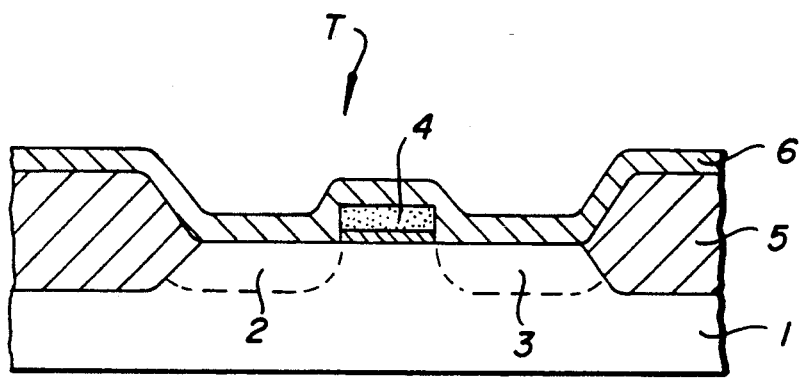
FIGS. 4(A)–(I) are cross sectional views showing various steps of manufacturing the BIC memory cell device according to another prior art manufacturing process.
Figure 4B:
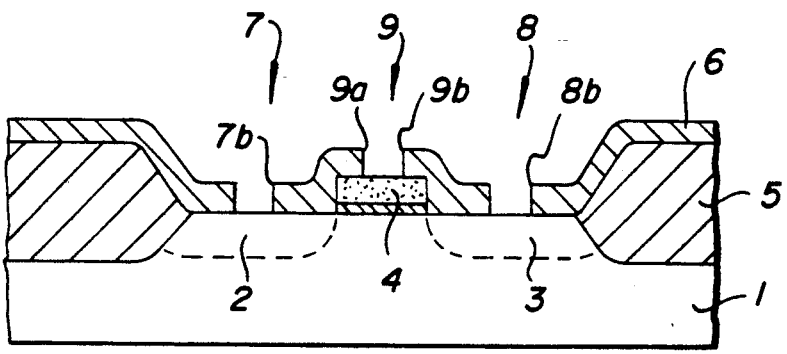

In a step of FIG. 4(A), the structure identical to that of the step of FIG. 2(A) is formed. Next, the holes 7-9 are formed through the PSG layer 6 in a step of FIG. 4(B). Then, the structure is subjected to heat treatment in a step of FIG. 4(C). As a result, the PSG layer 6 causes reflow and then there is formed a thin protective oxide layers 7d, 8d and 9d respectively covering the source region 2, the drain region 3 and the gate electrode 4. During this step, the sharp edges 7b-9b at the rim of the holes 7-9 are blunted and the inclined walls 7c-9c surrounding the holes 7-9 are formed. Next, the protective layer 8d covering the drain region 3 is selectively removed in a step of FIG. 4(D). In a step of FIG. 4(E), the insulator film 10 is deposited uniformly over the surface of the structure of FIG. 4(D). Then, in a step of FIG. 4(F), a part of the insulator film 10 is removed except for the part covering the drain region 3, and in a step of FIG. 4(G), the protective layers 7d and 9d are removed. In a step of FIG. 4(H), the wiring conductor layer 11 is deposited. Further, the wiring conductor layer 11 is patterned in a step of FIG. 4(I) and the structure similar to that obtained in the process of FIGS. 2(A)-(G) is obtained.

In this prior art process, one can avoid the problem of excessive etching of the source region 11 associated with the removal of the silicon nitride insulator film 18 by eliminating the step corresponding to the step of FIG. 2(E). However, the BIC memory cell device manufactured by such a process still involves a problem of unnecessarily large size due to the blunted shoulder or edge for the holes 7-9. As already described, such a BIC memory cell device is not suited for the integrated circuit memory device comprising numerous BIC memory cell devices particularly when the number of the devices assembled in a unit area of the integrated circuit memory device is enormous. Further, this prior art process includes the steps of opening the penetrating hole 7 (FIG. 4(B)) through the PSG layer 6, closing the penetrating hole 7 (FIG. 4(C)) immediately after it is opened, and again opening the penetrating hole 7 through the PSG layer 6. Thus, this prior art process involves unnecessarily large number of steps and the manufacturing cost of the device is increased.

Next, a first embodiment of the BIC memory cell device of the present invention will be described with reference to FIGS. 5(A)-(H).

Referring to the drawing, the BIC memory cell device comprises a substrate 20 similar to the substrate 1 of the prior art on which a source region 21, a drain region 22 and a channel region 20a are defined such that the channel region 20a is located between the source region 21 and the drain region 22. In the illustrated example, the drain region 22 has a so-called lightly doped drain (LDD) structure in which the drain region 22 comprises a lightly doped region 22a having an impurity level of about $1 \times 10^{18}/cm^3$ and a more heavily doped region having an impurity level of about $1 \times 10^{20}/cm^3$. As usual in a MOS structure, the substrate 20 is doped to a conductive type which is opposite to that of the source and drain regions 21 and 22. Further, a gate oxide layer 23a is formed on the substrate in correspondence to the channel region 20a and a gate electrode 23 is deposited on the gate oxide layer 23a. Thus, there is formed a MOS structure T1 and the structure T1 is separated from adjacent MOS structures by an oxide isolating structure 24 which is similar to the structure 5 of the prior art BIC memory cell device. Further, a PSG layer 25 of about 1 μm in the thickness is deposited on the surface of the MOS structure T1.

Figure 5A:
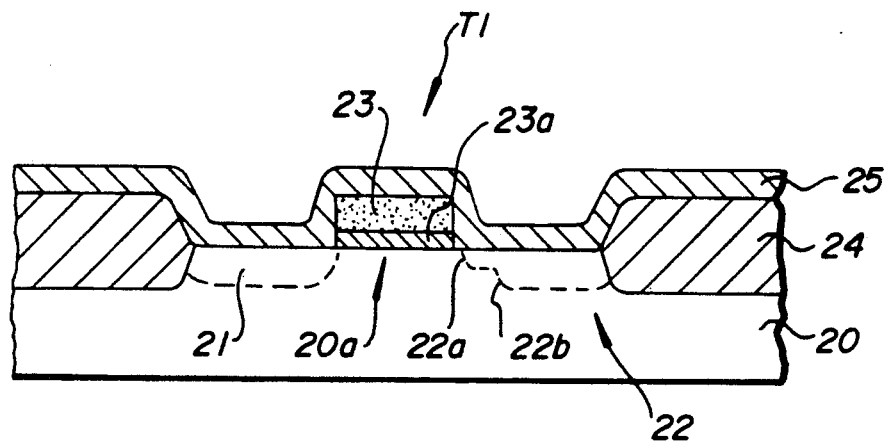
FIGS. 5(A)–(H) are cross sectional views showing various steps of manufacturing an improved BIC memory cell device according to a first embodiment process of the present invention.
Figure 5B:
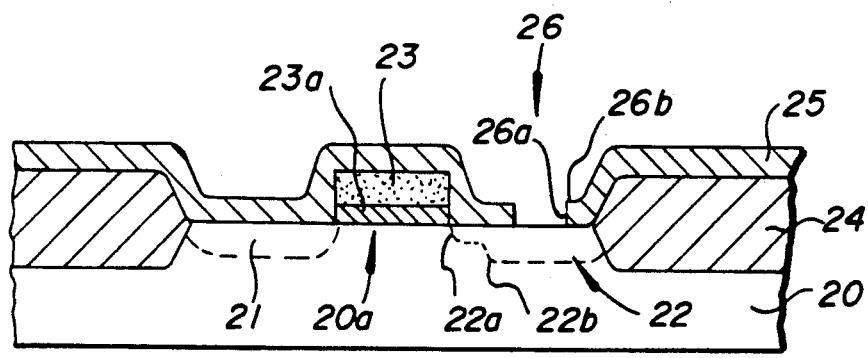

The PSG layer 25 is then removed in a step of FIG. 5(B) at a part corresponding to the drain region 22 of the MOS structure T1 by etching. The removal of the part of the PSG layer 25 may be made by the usual anisotropic etching such as the reactive ion etching (RIE). As a result of the etching, a hole 26 defined by the straight wall 26a and having the sharp edge 26b at the rim is formed in the PSG layer 25.

Figure 5C:
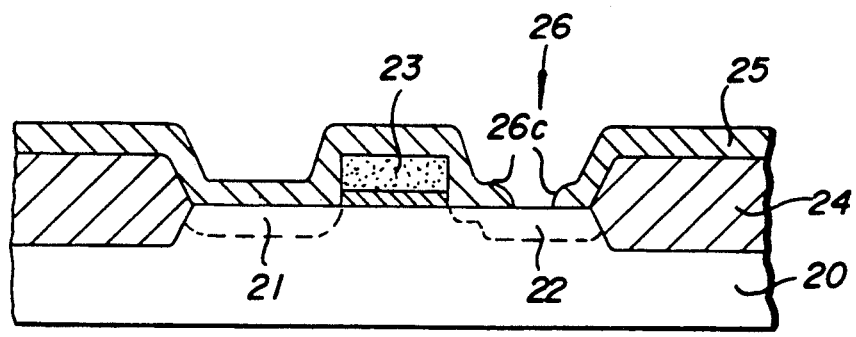

After the step of FIG. 5(B), the entire structure is annealed in a step of FIG. 5(C) and the sharp edge 26b is blunted as a result of the reflow of the PSG layer 25 associated with the annealing. Preferably, the annealing is made at a temperature of 950° C.-1050° C. for 5 to 10 minutes under a nitrogen atmosphere. Responsive to the annealing, the reflow of the PSG layer 25 occurs and the hole 26 is now defined by the blunted wall 26c. It should be noted that the hole for the source region 21 corresponding to the hole 7 of the prior art is not formed yet in the step of FIG. 5(C).

Figure 5D:
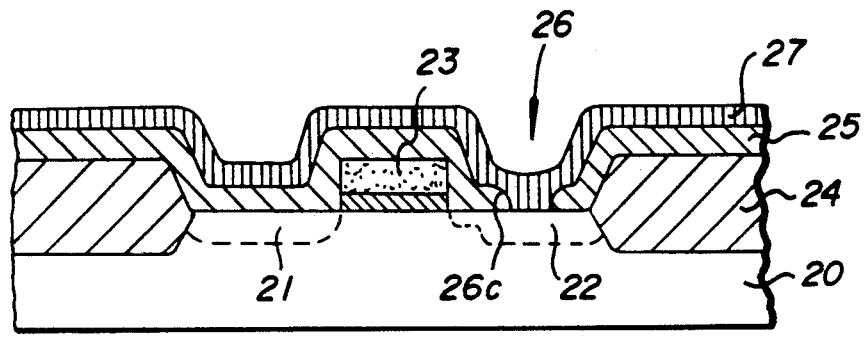

Next, an insulator film 27 similar to the film 10 of the prior art is deposited on the entire surface of the structure of FIG. 5(C) in a step of FIG. 5(D). The thickness of the insulator film 27 is typically about 50–120 Å. Any suitable methods such as sputtering, chemical vapor deposition, heat treatment oxidization or nitridation may be used for the formation of the film 27. Thus, the insulator film 27 makes a direct contact with the drain region 22 as well as with the blunted wall 26c of the PSG layer 25 which is one of the features of the BIC memory cell device of the present invention.

Figure 5E:
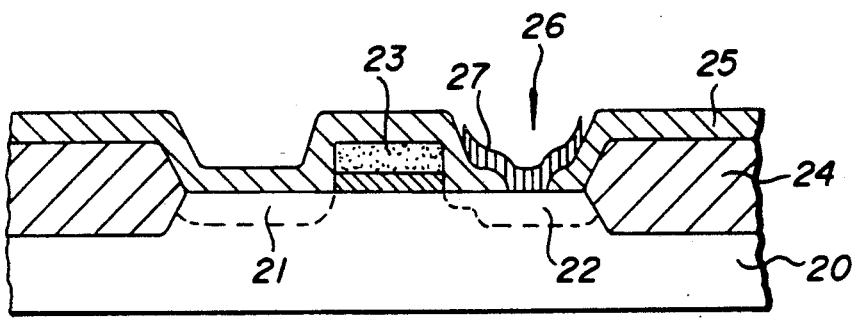
Figure 5F:
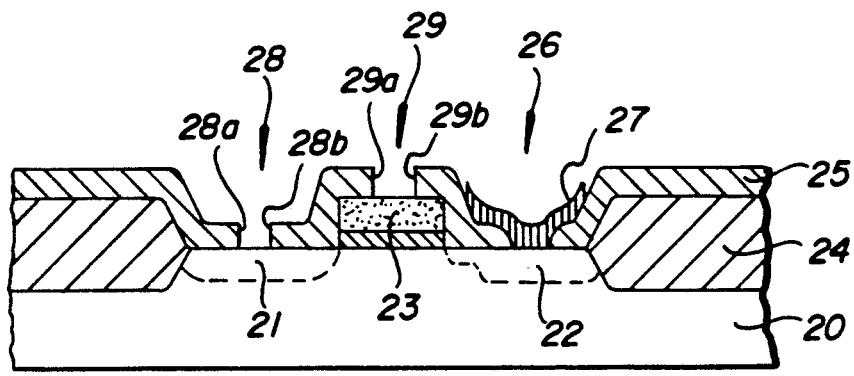
Figure 5G:
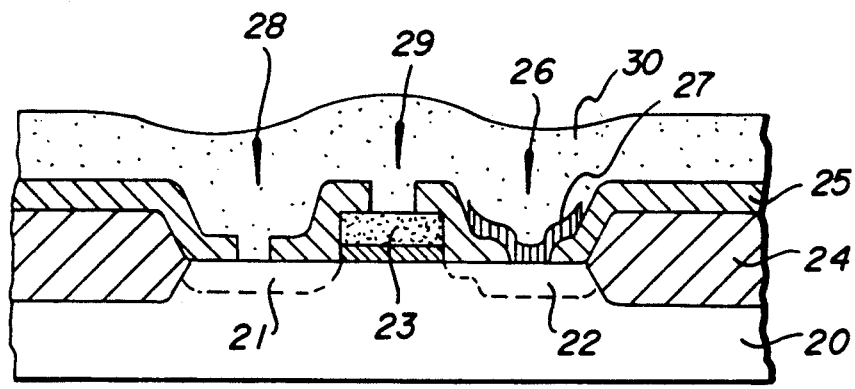
Figure 5H:
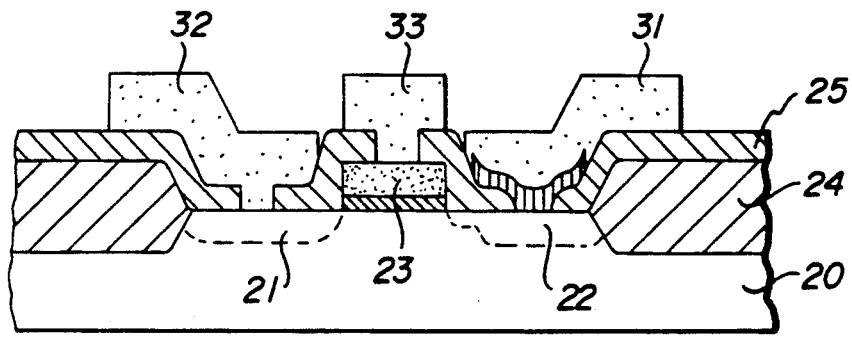

In a step of FIG. 5(E), the insulator film 27 is removed except for the part covering the hole 26 and the part of the PSG layer 25 surrounding the hole 26. Further, a hole 28 is formed through the PSG layer 25 in correspondence to the source region 21 in a step of FIG. 5(F). This hole 28 is made by the anisotropic etching technique such as RIE and the hole 28 is defined by a straight wall 28a extending perpendicularly to the surface of the substrate 20. Correspondingly thereto, the hole 28 is defined by a sharp edge 28b. In other words, the hole 28 does not have a wall such as the wall 26c which increases the diameter towards the top surface of the PSG layer 25. At the same time, a contact hole 29 is opened through the PSG layer 25 in correspondence to the gate electrode 23. In other words, the hole 28 and the hole 29 are opened simultaneously. The hole 29 has a similar cross section as that of the hole 28 and is defined by a straight wall 29a and a sharp rim 29b at the top of the hole 29. Next, the wiring conductor layer 30 is deposited on the entire structure in a step of FIG. 5(G) and finally the wiring conductor 30 is patterned to wiring electrodes 32, 33 and 34 respectively corresponding to the drain region 22, the source region 21 and the gate electrode 23 as shown in FIG. 5(H).

FIG. 6 shows a comparison of the BIC memory cell device of the present invention with the one obtained in the prior art process shown in FIGS. 2(A)-(G) or FIGS. 4(A)-(H). For the sake of simplicity, only essential parts of the structure are illustrated. In the drawing, these parts constructed identically to those corresponding parts in the preceding drawings are given identical reference numerals and the description thereof will be omitted.

From this drawing, it is clear that a diameter D of the hole 7 or 9 of the prior art BIC memory is reduced to a diameter d which is substantially smaller than the diameter D for the holes 28 and 29 of the device of the present invention. Responsive to the reduction in the diameter of the holes 28 and 29, the size of the BIC memory cell device of the present invention is reduced by a distance Δ as compared to the conventional device. The present structure is particularly effective in reducing the size of the MOS transistor T1 when the transistor is formed by an extremely fine patterning. For example, when the gate electrode extends for about 0.5 μm between the source region 21 and the drain region 22, a cell size reduction of up to 25% can be achieved.

Figure 4C:
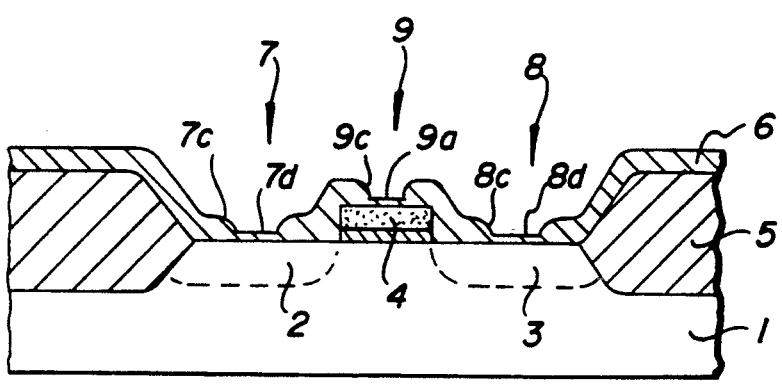
Figure 4D:
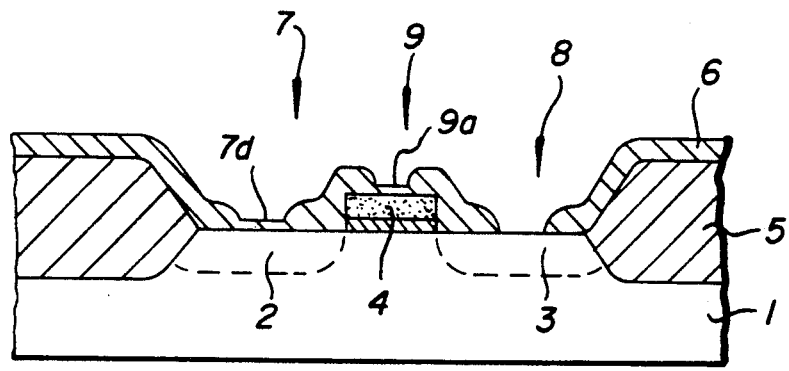
Figure 4E:
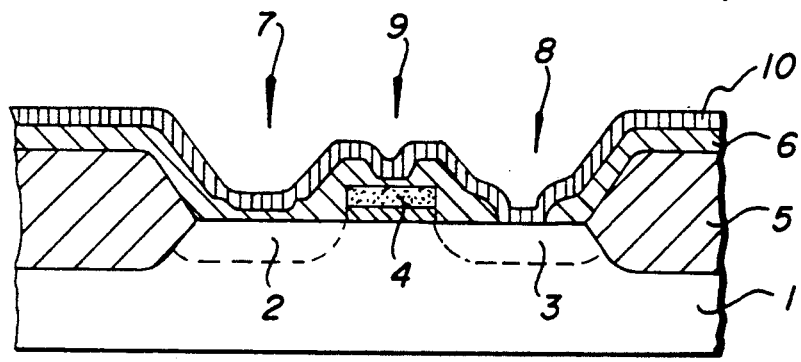
Figure 4F:
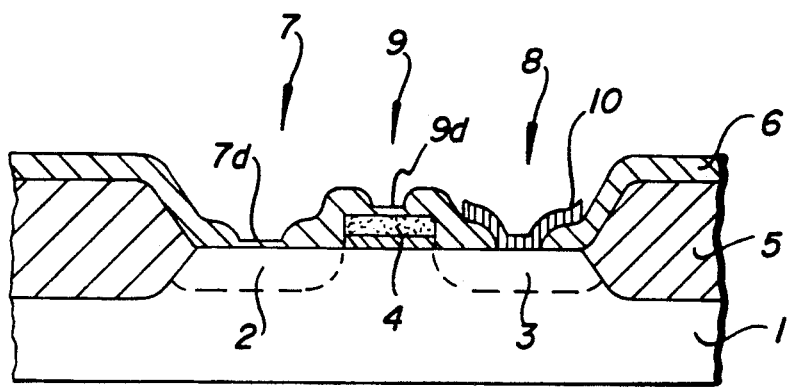
Figure 4G:
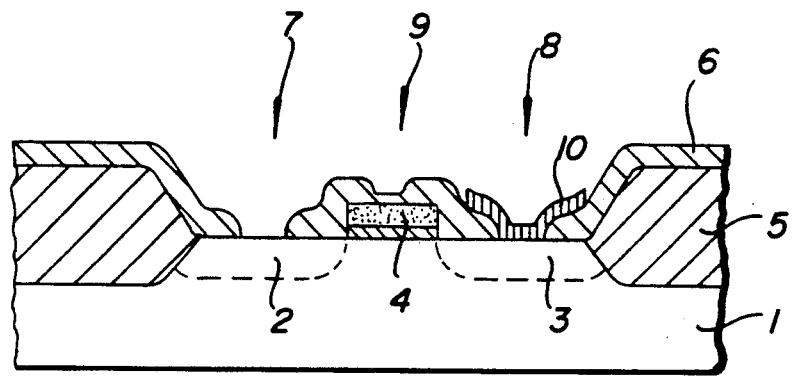
Figure 4H:
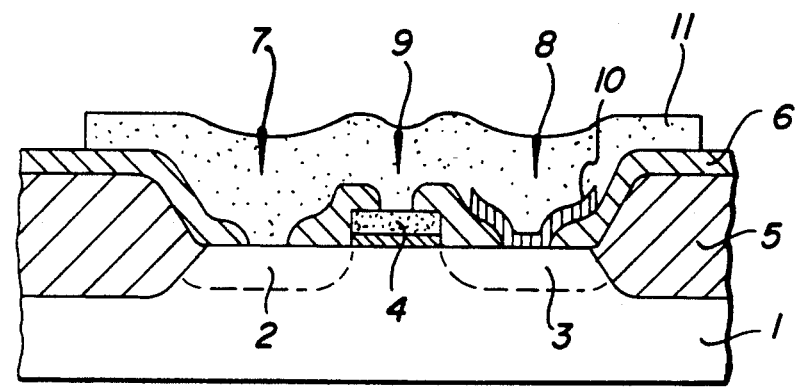
Figure 4I:
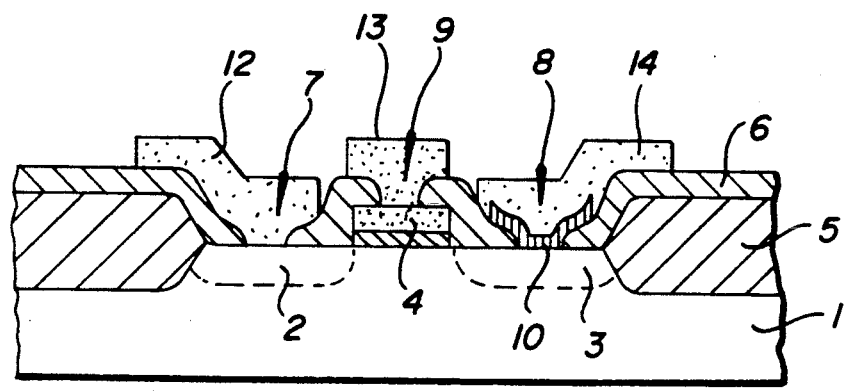

Further, the process of FIGS. 5(A)-(H) does not involve the step corresponding to the step of FIG. 4(C) and the step of FIG. 4(G) of the prior art manufacturing process and therefore the manufacturing process of the present invention is simplified as compared to the prior art process of FIGS. 4(A)-(I).

Figure 7A:
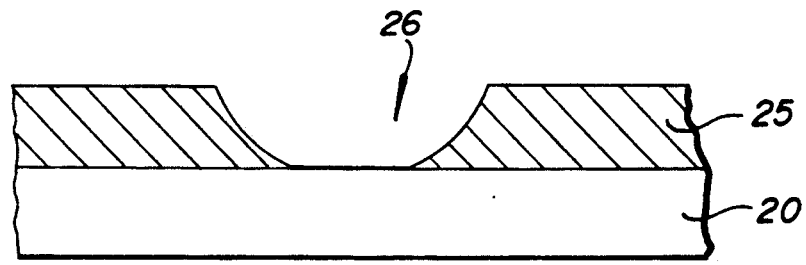
FIGS. 7(A) and (B) are cross sectional views showing a hole provided in the structure of the BIC memory cell device by alternative etching procedures.
Figure 7B:
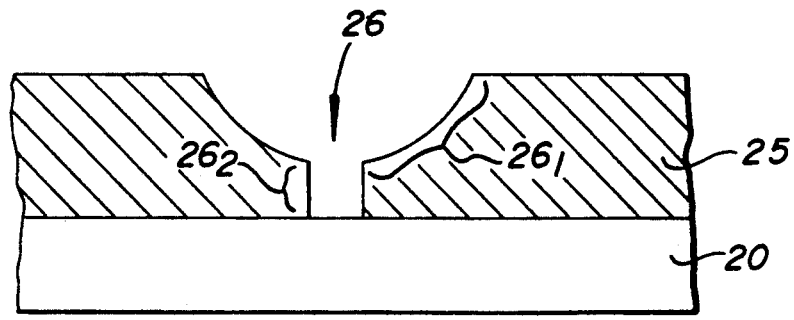

The etching process used for opening the hole 26 in the step of FIG. 5(B) is not limited to the reactive ion etching, but an isotropic etching process such as the wet etching using a hydrofluoric acid (HF) solution and an ammonium fluoride buffer solution, or a combination of the reactive ion etching and the isotropic etching may be used as well. When the isotropic etching is used, the hole 26 formed through the PSG layer 25 has a cross section which is substantially blunted from the beginning as shown in FIG. 7(A). In this case, the step of annealing shown in FIG. 5(C) can be omitted and the manufacturing process can be simplified. Further, as a result of elimination of the process of reflow corresponding to the step of FIG. 5(C), the material for the insulator layer 25 is not limited to the phospho-silicate glass having a low melting point but a material having a high melting point such as a silica glass deposited by CVD process, for example, may be used for the insulator layer 25. FIG. 7(B) is an example of the cross section of the hole 26 opened by a combination of the isotropic etching process and the RIE process. In this process, a first part 26₁ of the hole 26 is formed by the isotropic etching and then a second part 26₂ is formed by the RIE. Both of the cross sections of the hole 26 of FIGS. 7(A) and (B) are effective in preventing the premature breakdown of the insulator film 27 deposited thereon.

Figure 8A:
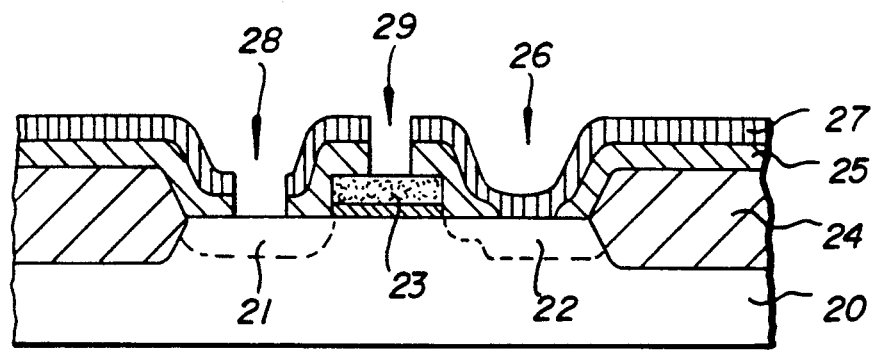
FIGS. 8(A)–(C) are cross sectional views showing a part of manufacturing steps according to another embodiment of the BIC memory cell device of the present invention.
Figure 8B:
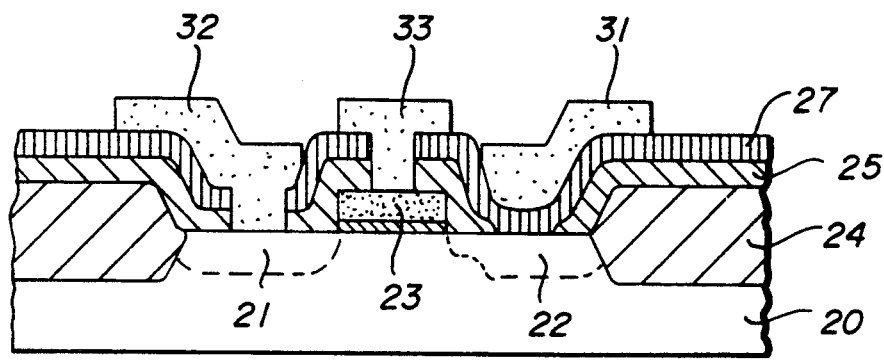
Figure 8C:
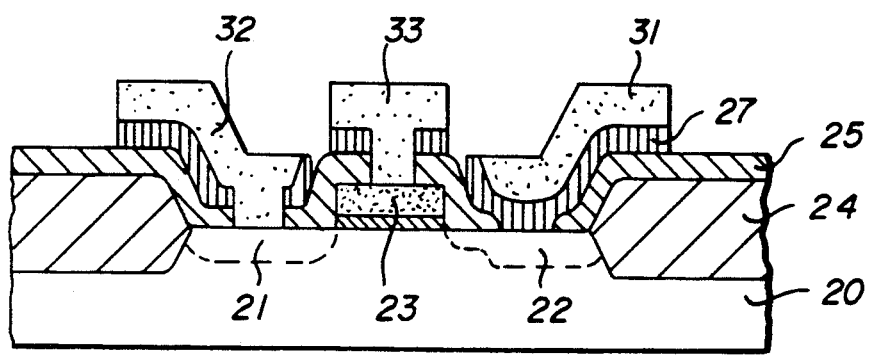

FIGS. 8(A)-(C) show another embodiment of the manufacturing process of the present invention and the structure obtained as a result of the manufacturing process. In the drawing, these parts constructed identically to those corresponding parts in the preceding drawings are given identical reference numerals and the description thereof will be omitted.

Referring to a step of FIG. 8(A), the holes 28 and 29 are formed in the structure obtained in the step of FIG. 5(D) directly through the PSG layer 25 and the insulator film 27. In other words, the holes 28 and 29 are formed so as to penetrate through the PSG layer 25 and the insulator film 27 deposited thereon. Next, the wiring electrodes 31, 32 and 33 are formed as illustrated in FIG. 8(B). The intervening steps of depositing the wiring conductor layer 30 and patterning the layer 30 thus deposited are omitted for the sake of simplicity. Then, a part of the insulator film 27 is removed except for those sandwiched between the PSG layer 25 and the wiring electrodes 31, 32 or 33 in a step of FIG. 8(C). The BIC memory cell device having a structure thus obtained has the insulator film 27 between the wiring electrode 31 and the PSG layer 25 but functions similarly to the BIC memory cell device obtained in the process of FIGS. 5(A)-(H). Further, one may eliminate the step of the FIG. 8(C). In this case, the surface of the BIC memory cell device is protected against moisture by the insulator film 27 and the manufacturing process is simplified at the same time.

Figure 9A:
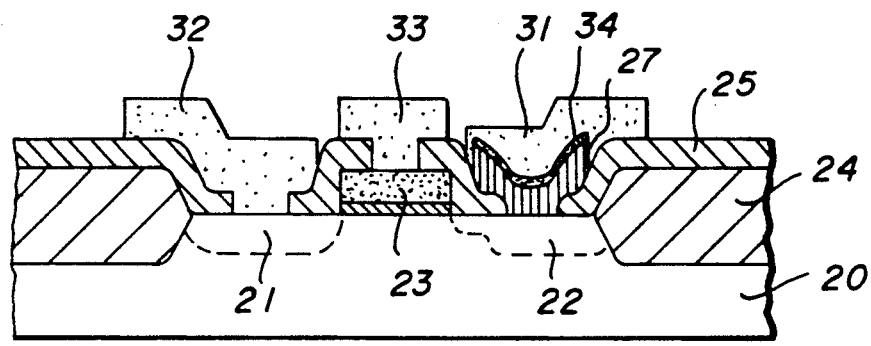
FIGS. 9(A) and (B) are cross sectional views showing still other embodiments of the BIC memory cell of the present invention.

FIGS. 9(A) and (B) show another embodiment of the manufacturing process of the present invention. In the drawing, these parts constructed identically to those corresponding parts in the preceding drawings are given identical reference numerals and the description thereof will be omitted.

In this embodiment, a protective layer 34 such as a thin polysilicon layer is deposited on the insulator film 27 after the film 27 is deposited on the PSG layer 25. Such a protective layer 34 protects the insulator film 27 when the surface of the insulator film 27 is prepared for the deposition of the wiring electrode 31 by etching. Such an etching is made in order to obtain a fresh surface for the insulator film 27 as well as for the PSG layer 25. However, as the thickness of the insulator film 27 is extremely small (50-120 Å), there is a substantial risk that the insulator film 27 is excessively removed by the etching. In the example of FIGS. 9(A) and (B), the excessive etching of the insulator film 27 is prevented by the polysilicon protective layer 34. The layer 34 may be a pure polysilicon when the thickness of the polysilicon protective layer 34 is in the order of about 500 Å. When the polysilicon layer 34 has a thickness of about 4000 Å, on the other hand, a doped polysilicon is used in order to secure an excellent electrical conductivity in the protective layer 34.

Figure 9B:
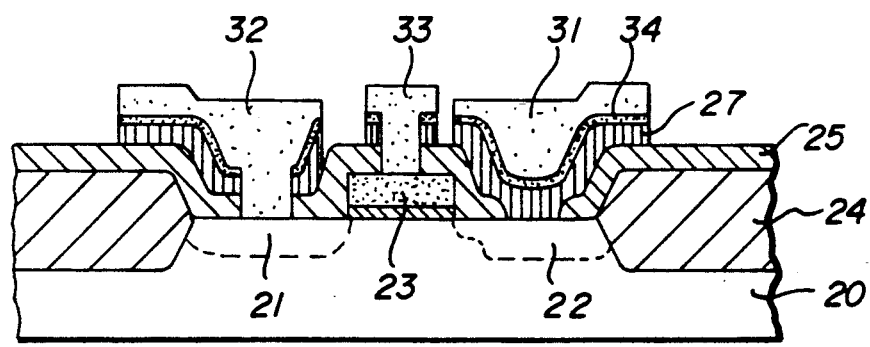

The structure of FIG. 9(A) is obtained by simply depositing the protective layer 34 on the insulator film 27 after the step of FIG. 5(D) and thereafter performing the process of FIGS. 5(E)-(H), while the structure of FIG. 9(B) is obtained by performing the process of FIGS. 8(A)-(C) after the deposition of the layer 34.

Further, the present invention is not limited to these embodiments but various variations and modifications may be made without departing from the scope of the invention.

What is claimed is:

1. A method of manufacturing a breakdown-of-insulator-for-conduction type memory cell device comprising steps of:

depositing a first insulating layer on a surface of a metal oxide semiconductor structure comprising a substrate doped to a first conductive type, a channel region defined in the substrate, a first and a second doped regions both doped to a second conductive type and defined in the substrate at both sides of said channel region, a gate insulator layer provided on a surface of the substrate in correspondence to said channel region and a gate electrode provided on said gate insulator layer;

providing a first opening penetrating through said first insulating layer at a part of the first insulating layer covering the first doped region such that said first doped region is exposed by said first opening, said first opening being formed such that the first opening is defined by an inclined first side wall which defines a diameter of said first opening such that the diameter increases towards a surface of the first insulating layer;

depositing a second insulating layer on said first insulating layer such that the second insulating layer is deposited on the inclined first side wall and such that the first doped region exposed by said first opening is covered by said second insulating layer, said second insulating layer making a direct contact with the first doped region;

providing a second opening and a third opening simultaneously through said first insulating layer so as to expose said second doped region and said gate electrode, said second and third openings being formed such that both of the openings are defined by second and third side walls having a straight vertical cross section when taken perpendicularly to the surface of the substrate and extending perpendicularly to said surface of the substrate, and said second and third openings further defined by sharp-edge rims to thereby reduce the overall size of said memory cell device;

depositing a wiring electrode layer such that the wiring electrode layer makes a contact with said second doped region and said gate electrode which are exposed by said second and third openings and such that the wiring electrode further makes a contact with a part of said second insulating layer covering the first doped region; and patterning the wiring electrode layer such that a first wiring electrode part, a second wiring electrode part and a third wiring electrode part are formed such that the first, second and the third wiring electrode parts are separated from each other and such that the second insulating layer is sandwiched between the first wiring electrode part and first doped region, the second wiring electrode part makes a contact with the second doped region, and the third wiring electrode part makes a contact with the gate electrode.

2. A method as claimed in claim 1 in which said step of providing the first opening comprises a step of opening the hole by an anisotropic etching process so that the first opening is defined by a straight side wall having a straight vertical cross section and extending perpendicularly to the surface of the substrate such that a sharp edge is defined at a rim of the first opening at the surface of the first insulating layer, and a step of blunting the sharply defined rim by a heat treatment under a condition which causes a reflow in the first insulating layer.

3. A method as claimed in claim 2 in which said first insulating layer comprises a phospho-silicate glass and said heat treatment is carried out at a temperature of about 950° C.–1050° C.

4. A method as claimed in claim 1 in which said step of forming the first opening comprises an isotropic etching process of the first insulating layer.

5. A method as claimed in claim 4 in which said isotropic etching is a wet etching process using a hydrofluoric solution as an etching agent.

6. A method as claimed in claim 1 further comprising a step of patterning the second insulating layer after the step of patterning the wiring electrode such that the second insulating layer is removed from a part of the first insulating layer not covered by the first wiring electrode part.

7. A method as claimed in claim 1 further comprising a step of patterning the second insulating layer after the step of depositing the second insulating layer such that the second insulating layer is removed from the first insulating layer except for the part covering the first doped region.

8. A method as claimed in claim 1 further comprising a step of depositing a protective layer on said second insulating layer before the step of depositing the wiring electrode layer.

9. A method as claimed in claim 8 in which said protective layer comprises polysilicon.

10. A breakdown-of-insulator-for-conduction type memory cell device comprising:

a substrate doped to a first conductive type;

a channel region defined in the substrate;

first and second doped regions both doped to a second conductive type and defined in the substrate at both sides of said channel region;

a gate insulator layer provided on said substrate so as to cover the channel region;

a gate electrode deposited on said gate insulator layer;

a first insulating layer covering the first doped region, the second doped region, and the gate electrode;

a first penetrating opening provided on said first insulating layer in correspondence to the first doped region such that the first doped region is exposed through said first penetrating opening, said first penetrating opening being defined by an inclined first side wall which defines a diameter of said first opening such that the diameter increases towards a top surface of the first insulating layer;

a second penetrating opening provided on said first insulating layer in correspondence to the second doped region such that the second doped region is exposed through said second penetrating opening, said second penetrating opening being defined by a second side wall having a straight vertical cross section when taken perpendicularly to the surface of the substrate;

a third penetrating opening provided on said first insulating layer in correspondence to the gate electrode such that the gate electrode is exposed through said third penetrating opening, said third penetrating opening being defined by a third side wall having a straight vertical cross section when taken perpendicularly to the surface of the substrate, said second and third penetrating openings further defined by sharp-edge rims to thereby reduce the overall size of said memory cell device;

a second insulating layer provided on said first insulating layer in correspondence to said first doped region so as to cover the first doped region exposed through said first penetrating opening, said second insulating layer making a direct contact with the inclined side wall and further making a direct contact with the first doped region;

a first wiring electrode deposited on said second insulating layer in correspondence to said first penetrating opening such that the second insulating layer is sandwiched between the first wiring electrode and the first doped region;

a second wiring electrode deposited on said second insulating layer in correspondence to said second penetrating opening such that the second wiring electrode makes a contact with said second doped region through said second penetrating hole; and a third wiring electrode deposited on said second insulating layer in correspondence to said third penetrating opening such that the third wiring electrode makes a contact with said gate electrode through said third penetrating opening.

* * * * *